(12) United States Patent
Kang et al.

(10) Patent No.: US 10,756,145 B2
(45) Date of Patent: Aug. 25, 2020

(54) ORGANIC LIGHT-EMITTING DISPLAY DEVICE HAVING A COLOR FILTER

(71) Applicant: LG Display Co., Ltd., Seoul (KR)

(72) Inventors: Ha-Na Kang, Seoul (KR); Chung-Sun Lim, Paju-si (KR); Seung-Beum Lee, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 20 days.

(21) Appl. No.: 16/116,125

(22) Filed: Aug. 29, 2018

(65) Prior Publication Data

US 2019/0067380 A1 Feb. 28, 2019

(30) Foreign Application Priority Data

Aug. 31, 2017 (KR) .......................... 10-2017-0110959

(51) Int. Cl.
*H01L 27/32* (2006.01)
*H01L 51/52* (2006.01)

(52) U.S. Cl.
CPC ........ *H01L 27/322* (2013.01); *H01L 27/3258* (2013.01); *H01L 51/5203* (2013.01); *H01L 51/5268* (2013.01); *H01L 51/5275* (2013.01); *H01L 51/5237* (2013.01); *H01L 2251/5323* (2013.01)

(58) Field of Classification Search
CPC ............. H01L 51/5268; H01L 51/5271; H01L 51/5275; H01L 51/5278; H01L 27/3258; H01L 2251/5369; H01L 27/322; G02B 5/0242

See application file for complete search history.

(56) References Cited

U.S. PATENT DOCUMENTS

| | | |
|---|---|---|
| 2015/0380466 A1 | 12/2015 | Koo et al. |
| 2016/0087247 A1 | 3/2016 | Kim |
| 2016/0126501 A1 | 5/2016 | Kim et al. |
| 2016/0293891 A1 | 10/2016 | Son |
| 2018/0088404 A1* | 3/2018 | Chae ..................... H01L 27/322 |

FOREIGN PATENT DOCUMENTS

KR   20180004375 A   1/2018

OTHER PUBLICATIONS

Combined Search and Examination Report dated Feb. 27, 2019 issued in the corresponding Great Britain Patent Application No. 1814196.0, pp. 1-9.

* cited by examiner

*Primary Examiner* — Thanhha S Pham
(74) *Attorney, Agent, or Firm* — Polsinelli PC

(57) ABSTRACT

An organic light-emitting display device includes a color filter disposed on a light-emitting structure. An over-coat layer may be disposed between the color filter and the light-emitting structure. Diffusion-beads are dispersed in the over-coat layer. Thus, in the organic light-emitting display device according to the aspect of the present disclosure, light efficiency may be increased without a process of forming micro-lens.

18 Claims, 3 Drawing Sheets

ORGANIC LIGHT-EMITTING DISPLAY DEVICE HAVING A COLOR FILTER

CROSS REFERENCE TO RELATED APPLICATION

This application claims the priority benefit of Korean Patent Application No. 10-2017-0110959, filed on Aug. 31, 2017, which is hereby incorporated by reference in its entirety as if fully set forth herein.

BACKGROUND

Field of the Disclosure

The present disclosure relates to an organic light-emitting display device including a color filter disposed on a light-emitting structure.

Description of the Background

Generally, an electronic appliance, such as a monitor, a TV, a laptop computer and a digital camera, includes a display device to realize an image. For example, the display device may include a liquid crystal display device and/or an organic light-emitting display device.

The organic light-emitting display device includes a light-emitting structure and a color filter to realize a full color spectrum. The light-emitting structure includes a first electrode, a light-emitting layer and a second electrode, which are sequentially stacked. The color filter is disposed on the light-emitting structure. For example, light generated by the light-emitting structure may be emitted to the outside through the color filter.

The color filter realizes the corresponding color by absorbing and/or blocking light of a specific wavelength range, so that the luminous efficiency of the organic light-emitting display device including the color filter may be decreased. Thus, the organic light-emitting display device including color filter may use a micro-lens structure to increase luminous efficiency. For example, the organic light-emitting display device comprises an over-coat layer which is disposed between the color filter and the light-emitting structure, and has a surface facing the light-emitting structure and being a concavo-convex shape.

The surface of the concavo-convex shape may be formed by a photo-lithography process. For example, a method of forming the organic light-emitting display device may include a step of forming the over-coat layer on the color filter, a step of partially exposing a surface of the over-coat layer by using a mask pattern, and a step of removing an exposed portion of the over-coat layer to form the concavo-convex shape at the surface of the over-coat layer.

However, since the amount of exposure in the photo-lithography process varies depending on the position, the concavo-convex shape formed by the photo-lithography process can have a depth deviation. The depth deviation of the concavo-convex shape formed at the surface of the over-coat layer can cause a luminance variation. Thus, the organic light-emitting structure includes a portion recognized by the view as a smear. Therefore, in the organic light-emitting structure, the quality of the image can be decreased due to the concavo-convex shape for the micro-lens structure.

SUMMARY

Accordingly, the present disclosure is directed to an organic light-emitting display device that substantially obviates one or more problems due to limitations and disadvantages of the background art.

More specifically, the present disclosure is to provide an organic light-emitting display device capable of preventing the degradation of the quality of the image due to the concavo-convex shape for micro-lens structure.

In addition, the present disclosure is to provide an organic light-emitting display device capable of increasing luminous efficiency without the photo-lithograph process.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided an organic light-emitting display device including a color filter on a lower substrate. An over-coat layer is disposed on the color filter. A light-emitting structure is disposed on the over-coat layer. First diffusion-beads are dispersed in the over-coat layer.

The first diffusion-beads may have refractive index different from the over-coat layer.

Second diffusion-beads may be disposed in the over-coat layer. The second diffusion-beads may be spaced away from the first diffusion-beads. The second diffusion-beads may have a shape different from the first diffusion-beads.

A refractive index of the second diffusion-beads may be the same as a refractive index of the first diffusion-beads.

A size of the second diffusion-beads may be smaller than a size of the first diffusion-beads.

Each of the first diffusion-beads may be circular shape. Each of the second diffusion-beads may be ellipse shape.

Each of the first diffusion-beads may include a core and a shield layer. The core may be surrounded by the shield layer.

The over-coat layer may include a light-absorbing material. The light-absorbing material may absorb light having a wavelength which realizes a second color different from a first color realized by the color filter.

In another aspect, the organic light-emitting display device comprises a light-emitting structure. The light-emitting structure includes a first electrode, a light-emitting layer and a second electrode, which are sequentially stacked. A color filter is disposed on the first electrode of the light-emitting structure. Diffusion-beads are disposed between the first electrode and the color filter. A first over-coat layer surrounds the diffusion-beads. A surface of the first over-coat layer facing the light-emitting structure is a flat plane.

In a further aspect, an organic light-emitting display device includes a color filter disposed on a lower substrate; a first over-coat layer disposed on the color filter; a second over-coat layer surrounding a side surface of the color filter and a side surface of the first over-coat layer; a light-emitting structure disposed on the over-coat layer; and pluralities of first and second diffusion-beads dispersed in the over-coat layer and having a refractive index different from the first and second over-coat layers, wherein the pluralities of first and second diffusion-beads function with the first and second over-coat layers to amplify light emitted from the light-emitting structure.

The first over-coat layer may be in direct contact with the first electrode.

A side surface of the color filter and a side surface of the first over-coat layer may be surrounded by a second over-coat layer. The second over-coat layer may include a material different from the first over-coat layer.

The second over-coat layer may be extended between the color filter and the first over-coat layer.

The side surface of the first over-coat layer may be tapered in a direction different from the side surface of the color filter.

The side surface of the color filter may be positively tapered.

An edge of the first electrode may be covered by a bank insulating layer. A horizontal distance of the first over-coat layer may be larger than a horizontal distance of a portion of the first electrode which is exposed by the bank insulating layer.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

In the drawings.

DETAILED DESCRIPTION

Figure 1A:
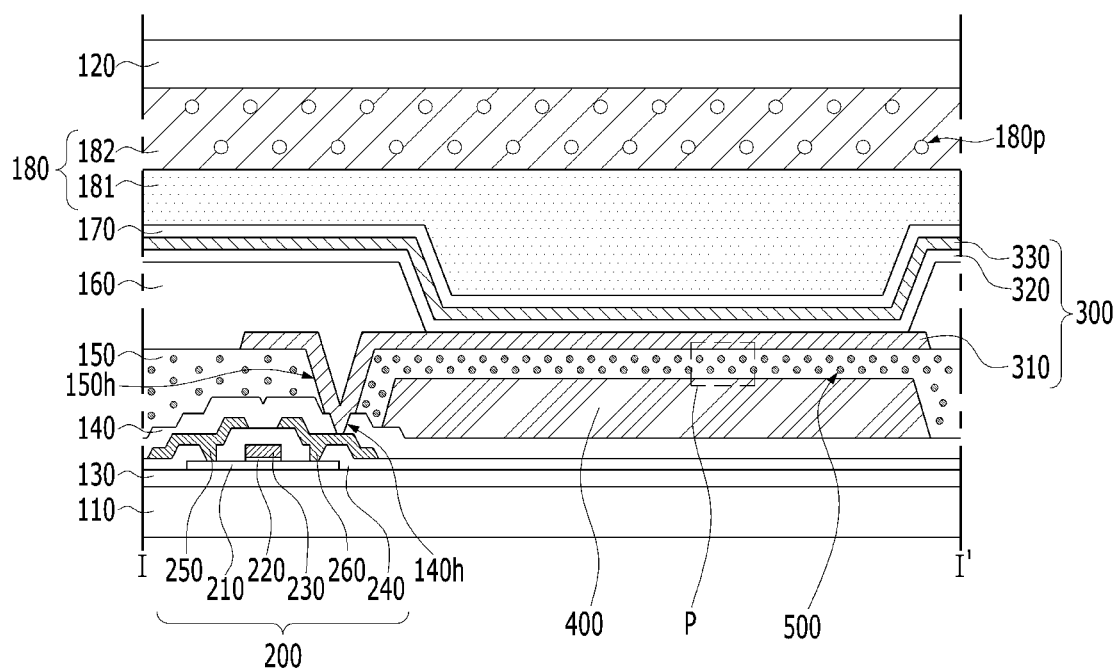
FIG. 1A is a view schematically showing an organic light-emitting display device according to an aspect of the present disclosure.

Hereinafter, details related to the above features, technical configurations, and operational effects of the aspects of the present disclosure will be clearly understood by the following detailed description with reference to the drawings, which illustrate some aspects of the present disclosure. Here, the aspects of the present disclosure are provided in order to allow the technical sprit of the present disclosure to be satisfactorily transferred to those skilled in the art, and thus the present disclosure may be embodied in other forms and is not limited to the aspects described below.

In addition, the same or extremely similar elements may be designated by the same reference numerals throughout the application and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrarily named according to the convenience of those skilled in the art without departing the technical sprit of the present disclosure.

The terms used in the specification of the present disclosure are merely used in order to describe particular aspects, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example aspects belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Figure 1B:
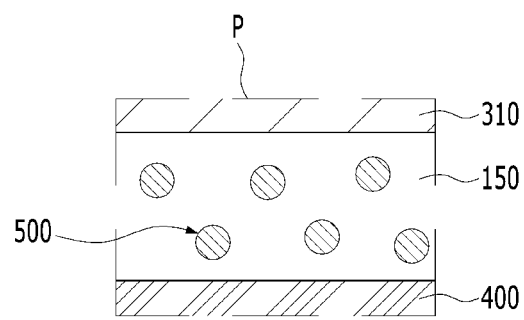
FIG. 1B is an enlarged view of P region in FIG. 1A.

FIG. 1A is a view showing an organic light-emitting display device according to an aspect of the present disclosure. FIG. 1B is an enlarged view of P region in FIG. 1A.

Referring to FIGS. 1A and 1B, the organic light-emitting display device according to the aspect of the present disclosure may include a lower substrate 110, an upper substrate 120, an over-coat layer 150, a light-emitting structure 300, a color filter 400 and a plurality of diffusion-beads 500.

The lower substrate 110 may support the light-emitting structure 300 and the color filter 400. The lower substrate 110 may include an insulating material. The lower substrate 110 may include a transparent material. For example, the lower substrate 110 may include glass or plastic.

The upper substrate 120 may be disposed on the lower substrate 110. The upper substrate 120 may be opposite to the lower substrate 110. The upper substrate 120 may include a material different from the lower substrate 110. The upper substrate 120 may include a material having a hardness of at least certain level. For example, the upper substrate 120 may include a metal, such as aluminum (Al), iron (Fe) and nickel (Ni).

The organic light-emitting display device according to the aspect of the present disclosure may further include a thin film transistor 200 disposed between the lower substrate 110 and the upper substrate 120. The thin film transistor 200 may be disposed close to the lower substrate 110. For example, the thin film transistor 200 may be disposed on an upper surface of the lower substrate 110 facing the upper substrate 120. The thin film transistor 200 may include a semiconductor pattern 210, a gate insulating layer 220, a gate electrode 230, an interlayer insulating layer 240, a source electrode 250 and a drain electrode 260.

The semiconductor pattern 210 may be disposed close to the lower substrate 110. The semiconductor pattern 210 may include a semiconductor material. For example, the semiconductor pattern 210 may include amorphous silicon or poly-silicon. The semiconductor pattern 210 may be an oxide semiconductor. For example, the semiconductor pattern 210 may include IGZO.

The semiconductor pattern 210 may include a source region, a drain region and a channel region. The channel region may be disposed between the source region and the drain region. The conductivity of the channel region may be lower than the conductivities of the source region and the drain region. For example, the source region and the drain region may include a conductive impurity.

The organic light-emitting display device according to the aspect of the present disclosure may further comprise a buffer layer 130 between the lower substrate 110 and the semiconductor pattern 210. The buffer layer 130 may be extended beyond the semiconductor pattern 210. For example, the buffer layer 130 may cover the upper surface of the lower substrate 110, entirely. The buffer layer 130 may include an insulating material. For example, the buffer layer 130 may include silicon oxide.

The gate insulating layer 220 may be disposed on the semiconductor pattern 210. The gate insulating layer 220 may partially cover an upper surface of the semiconductor pattern 210 facing the upper substrate 120. For example, the gate insulating layer 220 may overlap with the channel region of the semiconductor pattern 210.

The gate insulating layer 220 may include an insulating material. For example, the gate insulating layer 220 may include silicon oxide and/or silicon nitride. The gate insulating layer 220 may include a high-K material. For example, the gate insulating layer 220 may include hafnium oxide (HfO) or titanium oxide (TiO). The gate insulating layer 220 may have a multi-layer structure.

The gate electrode 230 may be disposed on the gate insulating layer 220. The gate electrode 230 may overlap the channel region of the semiconductor pattern 210. For example, the gate electrode 230 may be insulated from the semiconductor pattern 210 by the gate insulating layer 220.

The gate electrode 230 may include a conductive material. For example, the gate electrode 230 may include a metal, such as aluminum (Al), chrome (Cr), copper (Cu), titanium (Ti), molybdenum (Mo) and tungsten (W).

The interlayer insulating layer 240 may be disposed on the semiconductor pattern 210 and the gate electrode 230. The interlayer insulating layer 240 may be extended beyond the semiconductor pattern 210. For example, the interlayer insulating layer 240 may be in direct contact with the buffer layer 130 outside the semiconductor pattern 210.

The interlayer insulating layer 240 may include an insulating material. For example, the interlayer insulating layer 240 may include silicon oxide.

The source electrode 250 and the drain electrode 260 may be disposed on the interlayer insulating layer 240. The source electrode 250 may be electrically connected to the source region of the semiconductor pattern 210. The drain electrode 260 may be electrically connected to the drain region of the semiconductor pattern 210. The drain electrode 260 may be spaced away from the source electrode 250. For example, the interlayer insulating layer 240 may include a contact hole exposing the source region of the semiconductor pattern 210, and a contact hole exposing the drain region of the semiconductor pattern 210.

The source electrode 250 and the drain electrode 260 may include a conductive material. For example, the source electrode 250 and the drain electrode 260 may include a metal, such as aluminum (Al), chrome (Cr), copper (Cu), titanium (Ti), molybdenum (Mo) and tungsten (W). The drain electrode 260 may include a material same as the source electrode 250. The gate electrode 230 may include a material different from the source electrode 250 and the drain electrode 260.

The over-coat layer 150 may be disposed between the lower substrate 110 and the upper substrate 120. The over-coat layer 150 may be disposed close to the lower substrate 110. For example, the thin film transistor 200 may be covered by the over-coat layer 150, completely. The over-coat layer 150 may remove a thickness difference due to the thin film transistor 200. For example, an upper surface of the over-coat layer 150 facing the upper substrate 120 may be a flat surface. The upper surface of the over-coat layer 150 may be parallel with the upper surface of the lower substrate 110.

The over-coat layer 150 may include an insulating material. The over-coat layer 150 may include a material different from the interlayer insulating layer 240. For example, the over-coat layer 150 may include an organic insulating material.

The organic light-emitting display device according to the aspect of the present disclosure may further comprise a lower passivation layer 140 disposed between the thin film transistor 200 and the over-coat layer 150. The lower passivation layer 140 may prevent damage of the thin film transistor 200 due to external moisture and impact. The lower passivation layer 140 may be extended beyond the thin film transistor 200. The lower passivation layer 140 may include an insulating material. The lower passivation layer 140 may include a material different from the over-coat layer 150. For example, the lower passivation layer 140 may include silicon oxide and/or silicon nitride. The lower passivation layer 140 may have a multi-layer structure.

The light-emitting structure 300 may be disposed between the over-coat layer 150 and the upper substrate 120. The light-emitting structure 300 may generate light realizing a specific color. For example, the light-emitting structure 300 may include a first electrode 310, a light-emitting layer 320 and a second electrode 330, which are sequentially stacked.

The first electrode 310 may be disposed close to the over-coat layer 150. For example, the first electrode 310 may be in direct contact with the over-coat layer 150. The light-emitting structure 300 may be controlled by the thin film transistor 200. For example, the first electrode 310 may be electrically connected to the drain electrode 260 of the thin film transistor 200. The over-coat layer 150 may include an over contact hole 150h exposing the drain electrode 260 of the thin film transistor 200. The lower passivation layer 140 may include a lower contact hole 140h aligned with the over contact hole 150h. The first electrode 310 may be extended along a side wall of the lower contact hole 140h and a side wall of the over contact hole 150h.

The first electrode 310 may include a conductive material. The first electrode 310 may include a transparent material. For example, the first electrode 310 may be a transparent electrode formed of a transparent material, such as ITO and IZO.

The light-emitting layer 320 may generate light having luminance corresponding to a voltage difference between the first electrode 310 and the second electrode 330 of the light-emitting structure 300. For example, the light-emitting layer 320 may include an emitting material layer (EML) having an emission material. The emission material may be an organic material, an inorganic material or a hybrid material.

The light-emitting layer 320 may have a multi-layer structure. For example, the light-emitting layer 320 may further include at least one of a hole injection layer (HIL), a hole transporting layer (HTL), an electron transporting layer (ETL) and an electron injection layer (EIL).

The second electrode 330 may include a conductive material. The second electrode 330 may include a material different from the first electrode 310. For example, the second electrode 330 may include a metal having high reflectance. Thus, in the organic light-emitting display device according to the aspect of the present disclosure, the light generated by the light-emitting layer 320 may be emitted to outside through the first electrode 310 and the lower substrate 110.

The organic light-emitting display device according to the aspect of the present disclosure may further comprise a bank insulating layer 160 covering an edge of the first electrode 310. The thin film transistor 200 may overlap the bank insulating layer 160. For example, the bank insulating layer 160 may expose a portion of the first electrode 310 which is disposed at the outside of the thin film transistor 200. The lower contact hole 140h and the over contact hole 150h may overlap the bank insulating layer 160. The light-emitting layer 320 and the second electrode 330 may be stacked on the portion of the first electrode 310 which is exposed by the bank insulating layer 160. Thus, in the organic light-emitting display device according to the aspect of the present disclosure, the light toward the lower substrate 110 from the light-emitting layer 320 may be not blocked by the thin film transistor 200. The light-emitting layer 320 and the second electrode 330 may be extended on the bank insulating layer 160. The bank insulating layer 160 may include an insulating material. For example, the bank insulating layer 160 may include an organic insulating material. The bank insulating layer 160 may include a material different from the over-coat layer 150.

The organic light-emitting display device according to the aspect of the present disclosure may further comprise an upper passivation layer 170 disposed between the light-emitting structure 300 and the upper substrate 120. The upper passivation layer 170 may prevent damage of the light-emitting structure 300 due to the external moisture and impact. For example, the upper passivation layer 170 may be extended along the second electrode 330. The upper passivation layer 170 may be in direct contact with the second electrode 330. The upper passivation layer 170 may include an insulating material. For example, the upper passivation layer 170 may include silicon oxide and/or silicon nitride. The upper passivation layer 170 may have a multi-layer structure.

The organic light-emitting display device according to the aspect of the present disclosure may further comprise an encapsulating layer 180 disposed between the upper passivation layer 170 and the upper substrate 120. A space between the lower substrate 110 in which the light-emitting structure 300 is formed, and the upper substrate 120 may be filled by the encapsulating layer 180, completely. For example, the encapsulating layer 180 may be in direct contact with the upper passivation layer 170 and the upper substrate 120. The upper substrate 120 may be coupled to the lower substrate 110 in which the light-emitting structure 300 is formed, by the encapsulating layer 180. The encapsulating layer 180 may include an adhesive material. For example, the encapsulating layer 180 may include a thermosetting resin.

The encapsulating layer 180 may have a multi-layer structure. For example, the encapsulating layer 180 may include a first encapsulating layer 181 and a second encapsulating layer 182, which are sequentially stacked on the upper passivation layer 170. The second encapsulating layer 182 may be in direct contact with the first encapsulating layer 181 and the upper substrate 120. The encapsulating layer 180 may prevent the permeation of the external moisture. For example, the second encapsulating layer 182 may include a moisture-absorbing material 180p. A stress applied to the light-emitting structure 300 due to the expansion of the moisture-absorbing material 180p may be relieved by the first encapsulating layer 181. For example, the first encapsulating layer 181 may include a material different from the second encapsulating layer 182.

The color filter 400 may be disposed between the lower substrate 110 and the light-emitting structure 300. The light generated by the light-emitting structure 300 may be emitted to the outside through the color filter 400. For example, the color filter 400 may overlap the portion of the first electrode 310 which is exposed by the bank insulating layer 160. A horizontal distance of the color filter 400 may be larger than a horizontal distance of the portion of the first electrode 310 which is exposed by the bank insulating layer 160. Thus, the organic light-emitting display device according to the aspect of the present disclosure may prevent the light generated by each light-emitting structure 300 from traveling to the adjacent pixel region without passing through the corresponding color filter 400. Thereby, in the organic light-emitting display device according to the aspect of the present disclosure, light leakage may be prevented.

The color filter 400 may absorb and/or block light having a certain wavelength range. For example, color realized by the light which is generated by the light-emitting structure 300 may be converted by the color filter 400. The light-emitting structure 300 may generate light realizing variable colors depending on the material of the color filter 400. For example, the light-emitting structure 300 may generate light realizing white color.

The color filter 400 may be disposed between the lower substrate 110 and the over-coat layer 150. For example, the color filter 400 may be disposed between the lower passivation layer 140 and the over-coat layer 150. A thickness difference due to the color filter 400 may be removed by the over-coat layer 150. The color filter 400 may be covered by the over-coat layer 150, completely.

The plurality of diffusion-beads 500 may be dispersed in the over-coat layer 150. The light generated by the light-emitting structure 300 may enter the color filter 400 through the over-coat layer 150. The plurality of diffusion-beads 500 may refract and/or reflect the light passing though the over-coat layer 150. For example, the refractive index of the plurality of diffusion-beads 500 may be different from the refractive index of the over-coat layer 150. The light generated by the light-emitting structure 300 may be diffused by the plurality of diffusion-beads 500.

The plurality of diffusion-beads 500 may include a material different from the over-coat layer 150. For example, the plurality of diffusion-beads 500 may include an inorganic material, such as glass, talc, aluminum oxide and titanium oxide. Each of the plurality of diffusion-beads 500 may be spherical shape.

Accordingly, the organic light-emitting display device according to the aspect of the present disclosure may include the over-coat layer 150 disposed between the light-emitting structure 300 and the color filter 400, and the diffusion-beads of spherical shape which are dispersed in the over-coat layer 150, so that the light toward the color filter 400 from the light-emitting structure 300 may be refracted and/or reflected. Thus, in the organic light-emitting display device according to the aspect of the present disclosure, the light toward the color filter 400 from the light-emitting structure 300 may be diffused. Therefore, in the organic light-emitting display device according to the aspect of the present disclosure, a size of a light-emitting region may be increased. Also, the organic light-emitting display device according to the aspect of the present disclosure may prevent the light generated by the light-emitting structure 300 from being trapped in the over-coat layer 150 by total internal reflection. Thereby, in the organic light-emitting display device according to the aspect of the present disclosure, the amount of light which is emitted to the outside may be increased without the formation of a micro-lens structure.

The organic light-emitting display device according to the aspect of the present disclosure is described that the over-coat layer 150 has no influence on the light toward the color filter 400 from the light-emitting structure 300. However, in the organic light-emitting display device according to another aspect of the present disclosure, the purity of color realized by the color filter 400 may be increased by the over-coat layer 150. For example, in the organic light-emitting display device according to another aspect of the present disclosure, the over-coat layer 150 may include a light-absorbing material absorbing the light having wavelength of color different from color realized by the corresponding color filter 400. Generally, the organic light-emitting display device may realize blue color, red color and green color. For example, in the organic light-emitting display device according to another aspect of the present disclosure, the light-absorbing material of the over-coat layer 150 may absorb the light having a wavelength of 580 nm to 600 nm which is a value between the wavelength range of light realizing red color and the wavelength rage of light realizing green color. Thus, in the organic light-emitting display device according to another aspect of the present disclosure, luminous efficiency and color representation may be improved.

Figure 2:
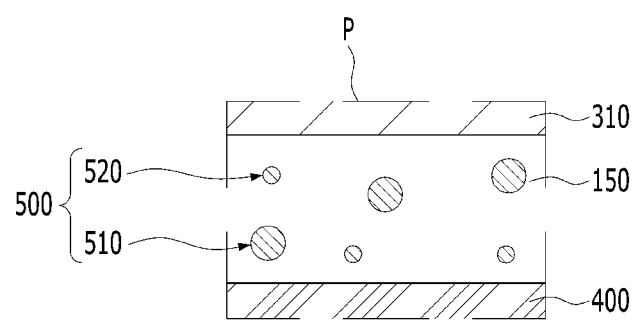
FIGS. 2 to 7 are views respectively showing the organic light-emitting display device according to another aspect of the present disclosure.
Figure 3:
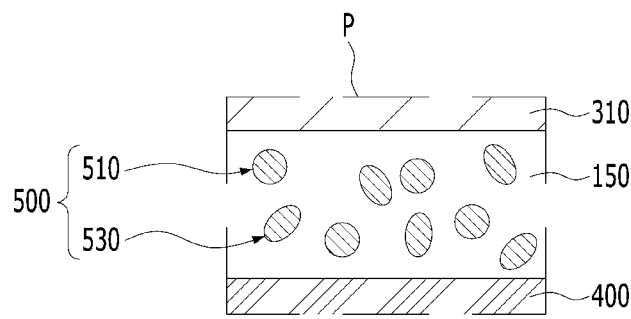

The organic light-emitting display device according to the aspect of the present disclosure is described that the plurality of diffusion-beads 500 in the over-coat layer 150 is single shape. However, in the organic light-emitting display device according to another aspect of the present disclosure, the plurality of diffusion-beads 500 may have a varying shape in the over-coat layer 150. For example, in the organic light-emitting display device according to another aspect of the present disclosure, the plurality of diffusion-beads 500 may include first diffusion-beads 510 having a spherical shape, and second diffusion-beads 520 having a spherical shape smaller than the first diffusion-beads 510, as shown in FIG. 2. For example, in the organic light-emitting display device according to another aspect of the present disclosure, the plurality of diffusion-beads 500 may include first diffusion-beads 510 having a spherical shape, and second diffusion-beads 530 having an ellipse shape, as shown in FIG. 3. In the organic light-emitting display device according to another aspect of the present disclosure, the second diffusion-beads 520 and 530 may include the same material as the first diffusion-beads 510. For example, the refractive index of the second diffusion-beads 520 and 530 may be the same as the refractive index of the first diffusion-beads 510. Thus, the organic light-emitting display device according to another aspect of the present disclosure may easily adjust the degree of refraction/reflection by the plurality of diffusion-beads 500 which is dispersed in the over-coat layer 150. Therefore, in the organic light-emitting display device according to another aspect of the present disclosure, the amount of light emitted to the outside may be increased, efficiently.

Figure 4:
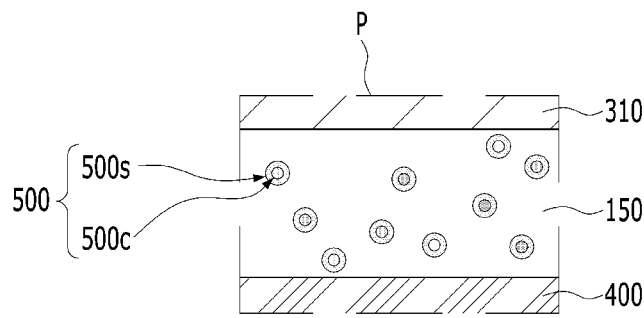

The organic light-emitting display device according to the aspect of the present disclosure is described that the plurality of diffusion beads 500 include a single material. However, in the organic light-emitting display device according to another aspect of the present disclosure, each of the plurality of diffusion-beads 500 may include a core 500c and a shield layer 500s, as shown in FIG. 4. The shield layer 500s may surround the core 500c. For example, the shield layer 500s may include a transparent material, such as glass, poly-styrene, poly-carbonate, and poly-methyl-methacrylate. The shield layer 500s may have the refractive index different from the over-coat layer 150. The core 500c may include a reflective material, such as talc, aluminum oxide, and titanium oxide. Thus, in the organic light-emitting display device according to another aspect of the present disclosure, the diffusion due to the plurality of diffusion-beads 500 may occur, efficiently.

Figure 5:
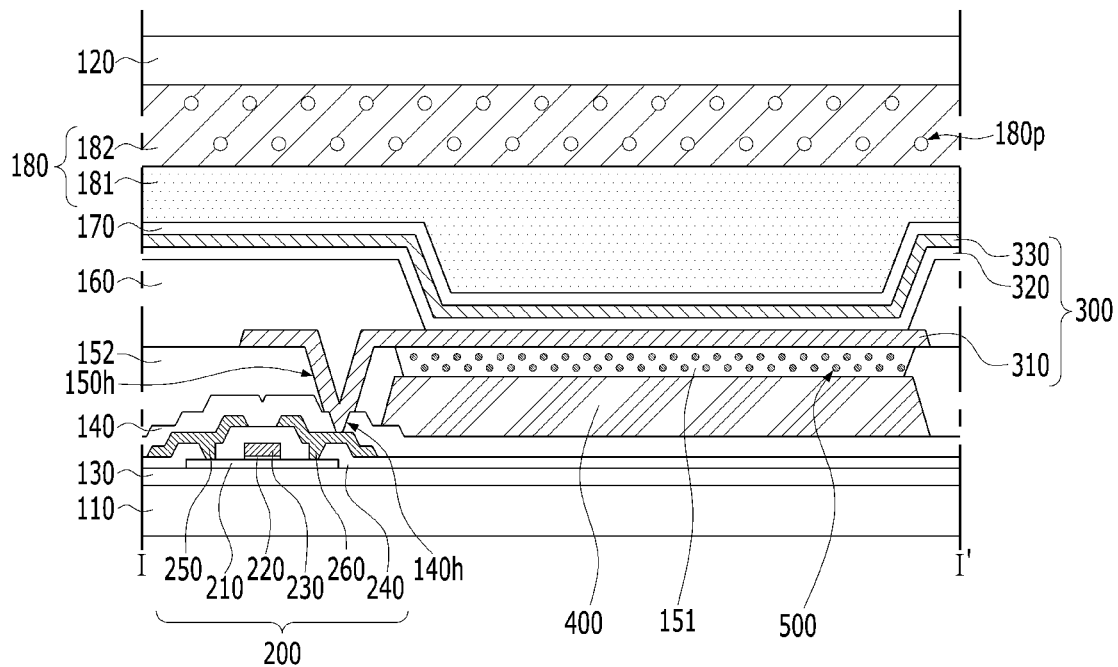

The organic light-emitting display device according to the aspect of the present disclosure is described that the over-coat layer 150 in which the plurality of diffusion-beads 500 are dispersed, is disposed on the upper surface of the lower substrate 110, entirely. However, the organic light-emitting display device according to another aspect of the present disclosure may include a first over-coat layer 151 disposed between the first electrode 310 and the color filter 400, and a second over-coat layer 152 disposed outside the first over-coat layer 151, as shown in FIG. 5. The plurality of diffusion-beads 500 may be dispersed in the first over-coat layer 151.

The first over-coat layer 151 may be in direct contact with the first electrode 310 and the color filter 400. For example, the first over-coat layer 151 in which the plurality of diffusion-beads 500 is dispersed, may completely fill a space between the portion of the first electrode 310 exposed by the bank insulating layer 160, and the color filter 400.

A horizontal distance of the first over-coat layer 151 may be larger than a horizontal distance of the portion of the first electrode 310 exposed by the bank insulating layer 160. The horizontal distance of the first over-coat layer 151 may be smaller than a horizontal distance of the color filter 400. For example, a side surface of the first over-coat layer 151 may be disposed between the first electrode 310 and the color filter 400. Thus, in the organic light-emitting display device according to another aspect of the present disclosure, all light generated by the light-emitting structure 300 may pass through the first over-coat layer 151. Therefore, the organic light-emitting display device according to another aspect of the present disclosure may prevent the refraction and/or the reflection by the plurality of diffusion-beads 500 from being performed in unnecessary area. The over contact hole 150h exposing the drain electrode 260 of the thin film transistor 200 may be disposed in the second over-coat layer 152.

The second over-coat layer 152 may surround the side surface of the first over-coat layer 151 and the side surface of the color filter 400. The side surface of the first over-coat layer 151 may be tapered in a direction opposite to the side surface of the color filter 400. The side surface of the color filter 400 may be positively tapered. For example, a method of forming the organic light-emitting display device according to another aspect of the present disclosure may include a step of forming the color filter 400 on the lower passivation layer 140, a step of forming the second over-coat layer 152 covering the color filter 400, a step of forming a contact hole exposing a surface of the color filter 400 in the second over-coat layer 152, and a step of filling the contact hole of the second over-coat layer 152 with the first over-coat layer 151 in which the plurality of diffusion-beads 500 is dispersed. Thus, the organic light-emitting display device according to another aspect of the present disclosure may include the diffusion-beads disposed only between the light-emitting structure 300 and the color filter 400.

The refractive index of the second over-coat layer 152 may be different from the refractive index of the first over-coat layer 151. For example, the second over-coat layer 152 may include a material different from the first over-coat layer 151. The light refracted or reflected by the plurality of diffusion-beads 500 toward the second over-coat layer 152 may be reflected again by refraction difference between the first over-coat layer 151 and the second over-coat layer 152 toward the first over-coat layer 151. Thus, in the organic light-emitting display device according to another aspect of the present disclosure, luminous efficiency may be increased, efficiently.

Figure 6:
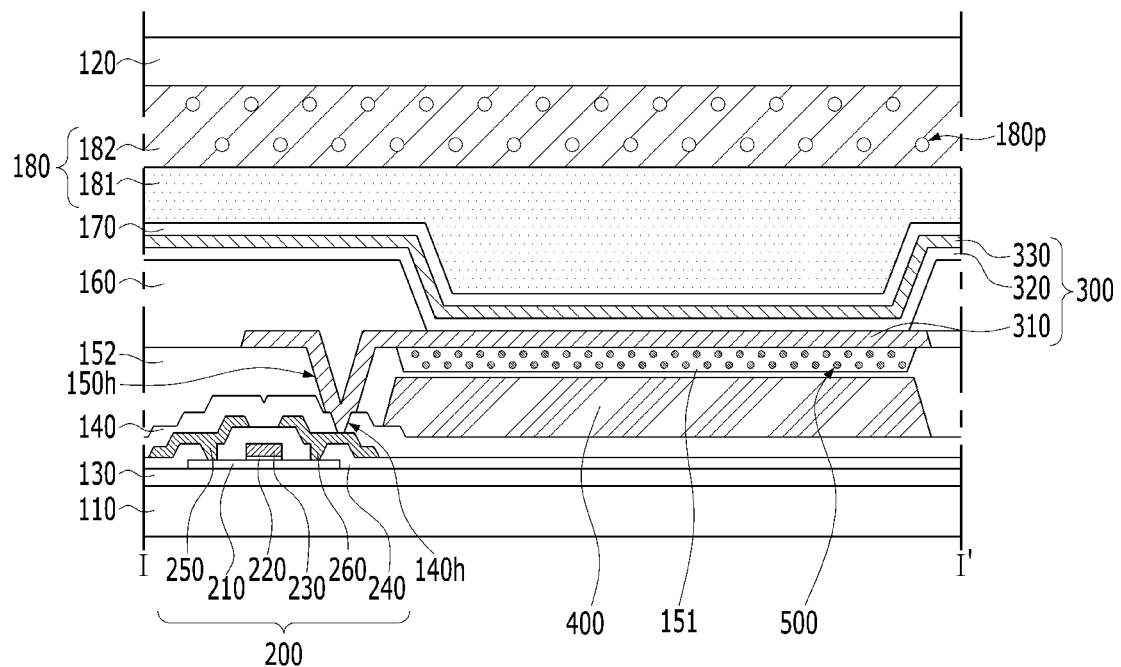

The organic light-emitting display device according to another aspect of the present disclosure is described that the first over-coat layer 151 is in direct contact with the color filter 400. However, in the organic light-emitting display device according to further another aspect of the present disclosure, the second over-coat layer 152 may be extended between the first over-coat layer 151 and the color filter 400, as shown in FIG. 6. Thus, in the organic light-emitting display device according to further another aspect of the present disclosure, the degree of the refraction/reflection by the plurality of diffusion-beads 500 may be adjusted, efficiently.

Figure 7:
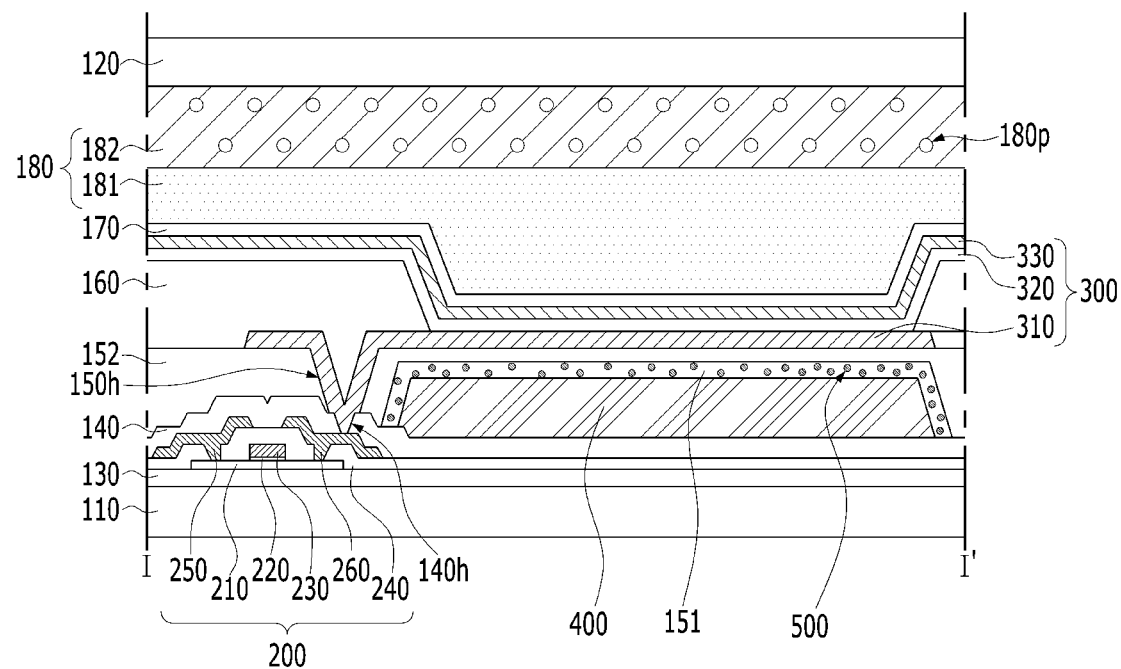

The organic light-emitting display device according to another aspect of the present disclosure is described that the side surface of the first over-coat layer 151 is tapered in a direction opposite to the side surface of the color filter 400. However, in the organic light-emitting display device according to further another aspect of the present disclosure, the side surface of the first over-coat layer 151 may be tapered in a direction same as the side surface of the color filter 400. For example, in the organic light-emitting display device according to further another aspect of the present disclosure, the first over-coat layer 151 may cover the color filter 400, as shown in FIG. 7. In the organic light-emitting display device according to further another aspect of the present disclosure, the first over-coat layer 151 may be formed before the second over-coat layer 152. In the organic light-emitting display device according to further another aspect of the present disclosure, the first over-coat layer 151 may be spaced away from the first electrode 310. Thus, in the organic light-emitting display device according to further another aspect of the present disclosure, the degree of freedom in the step of forming the first over-coat layer 151 and the second over-coat layer 152 may be improved. Therefore, in the organic light-emitting display device according to further another aspect of the present disclosure, luminous efficiency can be improved by the plurality of diffusion-beads 500.

In the result, the organic light-emitting display device according to the aspects of the present disclosure may include the over-coat layer disposed between the light-emitting structure and the color filter, and the diffusion-beads dispersed in the over-coat layer, so that the amount of light emitted to the outside may be increased without the formation of the concavo-convex shape for the micro-lens structure. Thereby, in the organic light-emitting display device according to the aspects of the present disclosure, luminous efficiency may be increased without the degradation of the quality of the image.

What is claimed is:

1. An organic light-emitting display device comprising:
a color filter on a lower substrate;
an over-coat layer on the color filter;
a light-emitting structure on the over-coat layer;
a plurality of first diffusion-beads dispersed in the over-coat layer; and
a plurality of second diffusion-beads disposed in the over-coat layer,
wherein the plurality of second diffusion-beads is spaced apart from the plurality of first diffusion-beads, and
wherein the plurality of second diffusion-beads has a shape different from the plurality of first diffusion-beads.

2. The organic light-emitting display device according to claim 1, wherein the plurality of first diffusion-beads has a refractive index different from the over-coat layer.

3. The organic light-emitting display device according to claim 1, wherein the refractive index of the plurality of second diffusion-beads is the same as the refractive index of the plurality of first diffusion-beads.

4. The organic light-emitting display device according to claim 1, wherein the plurality of second diffusion-beads is smaller than the plurality of first diffusion-beads.

5. The organic light-emitting display device according to claim 1, wherein each of the plurality of first diffusion-beads has a circular shape, and each of the plurality of second diffusion-beads has an ellipse shape.

6. The organic light-emitting display device according to claim 1, wherein each of the plurality of first diffusion-beads includes a core and a shield layer surrounding the core.

7. The organic light-emitting display device according to claim 1, wherein the over-coat layer includes a light-absorbing material that absorbs light having a wavelength realizing a second color different from a first color realized by the color filter.

8. An organic light-emitting display device comprising:
a light-emitting structure including a first electrode, a light-emitting layer and a second electrode, which are sequentially stacked;
a color filter under the first electrode of the light-emitting structure;
a plurality of diffusion-beads between the first electrode and the color filter; and
a first over-coat layer surrounding the plurality of diffusion-beads,
wherein the first over-coat layer facing the light-emitting structure has a flat surface,
wherein the plurality of diffusion-beads includes first diffusion-beads and at least one second diffusion-bead having a shape different from the plurality of first diffusion-beads, and
wherein the at least one second diffusion-bead is spaced apart from the plurality of first diffusion-beads.

9. The organic light-emitting display device according to claim 8, wherein the first over-coat layer is in direct contact with the first electrode.

10. The organic light-emitting display device according to claim 8, further comprising a second over-coat layer surrounding a side surface of the color filter and a side surface of the first over-coat layer,
wherein the second over-coat layer includes a material different from the first over-coat layer.

11. The organic light-emitting display device according to claim 10, wherein the second over-coat layer is extended between the color filter and the first over-coat layer.

12. The organic light-emitting display device according to claim 10, wherein the side surface of the first over-coat layer is tapered in a direction opposite to the side surface of the color filter.

13. The organic light-emitting display device according to claim 12, wherein the side surface of the color filter is positively tapered.

14. The organic light-emitting display device according to claim 8, further comprising a bank insulating layer covering an edge of the first electrode, wherein a horizontal distance of the first over-coat layer is longer than a horizontal distance of a portion of the first electrode which is exposed by the bank insulating layer.

15. An organic light-emitting display device comprising:
a color filter disposed on a lower substrate;
a first over-coat layer disposed on the color filter;
a second over-coat layer surrounding a side surface of the color filter and a side surface of the first over-coat layer;
a light-emitting structure disposed on the over-coat layer; and
pluralities of first and second diffusion-beads dispersed in the first over-coat layer and having a refractive index different from the first and second over-coat layers, wherein the pluralities of first and second diffusion-beads function with the first and second over-coat layers to amplify light emitted from the light-emitting structure,
wherein the pluralities of first and second diffusion-beads are spaced apart from each other, and
wherein the pluralities of first and second diffusion-beads are different from each other in shape.

16. The organic light-emitting display device according to claim 15, wherein the second over-coat layer is formed of a different material from the first over-coat layer.

17. The organic light-emitting display device according to claim 16, wherein the plurality of first diffusion-beads has a refractive index the same as the plurality of second diffusion-beads.

18. The organic light-emitting display device according to claim 15, wherein the pluralities of first and second diffusion-beads are different from each other in size.

* * * * *